(12) United States Patent
Nordhoff

(10) Patent No.: US 11,749,568 B2
(45) Date of Patent: Sep. 5, 2023

(54) METHOD FOR FORMING A PRE-CONNECTION LAYER ON A SURFACE OF A CONNECTION PARTNER AND METHOD FOR MONITORING A CONNECTION PROCESS

(71) Applicant: Infineon Technologies AG, Neubiberg (DE)

(72) Inventor: Sebastian Nordhoff, Lippstadt (DE)

(73) Assignee: Infineon Technologies AG, Neubiberg (DE)

( * ) Notice: Subject to any disclaimer, the term of this patent is extended or adjusted under 35 U.S.C. 154(b) by 359 days.

(21) Appl. No.: 17/013,923

(22) Filed: Sep. 8, 2020

(65) Prior Publication Data

US 2021/0082775 A1  Mar. 18, 2021

(30) Foreign Application Priority Data

Sep. 12, 2019  (EP) ..................................... 19196904

(51) Int. Cl.
*H01L 21/66* (2006.01)
*H01L 23/00* (2006.01)

(52) U.S. Cl.
CPC .............. *H01L 22/12* (2013.01); *H01L 24/83* (2013.01); *H01L 2224/8384* (2013.01)

(58) Field of Classification Search
CPC ......... H01L 22/12; H01L 22/22; H01L 22/24; H01L 22/26; H01L 22/30;

(Continued)

(56) References Cited

U.S. PATENT DOCUMENTS

| 4,810,672 A | 3/1989 | Schwarzbauer |
| 5,411,897 A * | 5/1995 | Harvey ..................... B23K 1/20 228/8 |

(Continued)

FOREIGN PATENT DOCUMENTS

| JP | H6112295 A | 4/1994 |
| WO | 2006078000 A2 | 7/2006 |
| WO | 2008006340 A1 | 1/2008 |

OTHER PUBLICATIONS

Klaka, Sven, "Der Verbindungsmechanismus", Niedertemperatur-Verbindungstechnik zum Aufbau von Leistungshalbleitermodulen, 1997, pp. 9-41.

(Continued)

*Primary Examiner* — Khiem D Nguyen
(74) *Attorney, Agent, or Firm* — Murphy, Bilak & Homiller, PLLC

(57) ABSTRACT

A method for forming a connection between two connection partners includes: forming a pre-connection layer on a first surface of a first connection partner, the pre-connection layer including a certain amount of liquid; performing a pre-connection process, thereby removing liquid from the pre-connection layer; performing photometric measurements while performing the pre-connection process, wherein performing the photometric measurements includes determining at least one photometric parameter of the pre-connection layer, wherein the at least one photometric parameter changes depending on the fluid content of the pre-connection layer; and constantly evaluating the at least one photometric parameter, wherein the pre-connection process is terminated when the at least one photometric parameter is detected to be within a desired range.

15 Claims, 2 Drawing Sheets

(58) Field of Classification Search
CPC ..... H01L 2224/8384; H01L 2224/2732; H01L 2224/27418; H01L 2224/27505; H01L 2224/29339; H01L 2224/83201; H01L 2224/83203; H01L 24/27; H01L 24/83; H01L 24/743; H01L 24/29; H01L 24/32; H01L 24/40; H01L 24/45; H01L 24/48; B23K 35/0244; B22F 7/064
USPC .......................................................... 438/16
See application file for complete search history.

(56) References Cited

U.S. PATENT DOCUMENTS

| | | | | |
|---|---|---|---|---|
| 5,564,183 | A * | 10/1996 | Satou | H05K 13/083 |
| | | | | 29/714 |
| 5,982,927 | A | 11/1999 | Koljonen | |
| 9,246,073 | B2 * | 1/2016 | Sasaoka | B23K 35/025 |
| 9,414,512 | B2 * | 8/2016 | Nagatomo | H01L 23/3735 |
| 9,831,157 | B2 * | 11/2017 | Sunachi | H01L 23/3736 |
| 2004/0232386 | A1 * | 11/2004 | Yorita | C25D 1/10 |
| | | | | 257/E21.175 |
| 2015/0257280 | A1 * | 9/2015 | Ciliox | B23K 1/0016 |
| | | | | 427/372.2 |
| 2016/0284662 | A1 * | 9/2016 | Wada | B23K 1/06 |
| 2017/0117209 | A1 * | 4/2017 | Benedikt | H01L 24/84 |
| 2020/0335416 | A1 * | 10/2020 | Yamasaki | B23K 35/0244 |

OTHER PUBLICATIONS

Klaka, Sven, "Niedertemperatur-Verbindungstechnik", Niedertemperatur-Verbindungstechnik zum Aufbau von Leistungshalbleitermodulen, 1997, pp. 5-8.

* cited by examiner

METHOD FOR FORMING A PRE-CONNECTION LAYER ON A SURFACE OF A CONNECTION PARTNER AND METHOD FOR MONITORING A CONNECTION PROCESS

TECHNICAL FIELD

The instant disclosure relates to a method for forming a connection between two connection partners and to a method for monitoring a connection process, in particular a sintering process.

BACKGROUND

Power semiconductor module arrangements often include at least one semiconductor substrate arranged in a housing. A semiconductor arrangement including a plurality of controllable semiconductor elements (e.g., two IGBTs in a half-bridge configuration) is arranged on each of the at least one substrate. Each substrate usually comprises a substrate layer (e.g., a ceramic layer), a first metallization layer deposited on a first side of the substrate layer and a second metallization layer deposited on a second side of the substrate layer. The controllable semiconductor elements are mounted, for example, on the first metallization layer. The second metallization layer may optionally be attached to a base plate. The controllable semiconductor devices are usually mounted onto the semiconductor substrate by soldering or sintering techniques. When mounting the controllable semiconductor devices to the substrate, e.g., by sintering, the semiconductor devices are usually pressed onto the first metallization layer with a certain amount of force and, optionally, under the influence of high temperature.

Sinter connections generally may not only be formed between semiconductor devices and semiconductor substrates, but also between any other suitable connection partners in the field of semiconductor modules as well as in other technical fields. Sinter connections should be reliable, e.g., in terms of mechanical stability and thermal performance (thermal conductivity). However, due to process instabilities, for example, a certain amount of connections out of a plurality of sinter connections may be faulty.

There is a need for a method for forming a connection between two connection elements and for a method for monitoring a connection process that allow to prevent the formation of or to reliably identify faulty sinter connections so as to be able to prevent or sort out elements with a faulty sinter connection in order to avoid subsequent field failures.

SUMMARY

A method for forming a connection between two connection partners includes forming a pre-connection layer on a first surface of a first connection partner, wherein the pre-connection layer comprises a certain amount of liquid, performing a pre-connection process, thereby removing liquid from the pre-connection layer, performing photometric measurements while performing the pre-connection process, wherein performing the photometric measurements comprises determining at least one photometric parameter of the pre-connection layer, wherein the at least one photometric parameter changes depending on the fluid content of the pre-connection layer, and constantly evaluating the at least one photometric parameter, wherein the pre-connection process is terminated when the at least one photometric parameter is detected to be within a desired range.

A method for monitoring a connection process for forming connections between two connection partners includes successively forming a plurality of pre-connection layers, after forming a pre-connection layer, performing photometric measurements, wherein performing the photometric measurements includes determining at least one photometric parameter of the pre-connection layer, wherein the at least one photometric parameter depends on the fluid content of the pre-connection layer, and evaluating the at least one photometric parameter. Each pre-connection layer is formed on a first surface of a first connection partner. Each pre-connection layer includes a certain amount of liquid. Forming a pre-connection layer includes performing a pre-connection process under certain process conditions, thereby removing liquid from the pre-connection layer. The method further includes interrupting the process of forming a plurality of pre-connection layers if the at least one photometric parameter is detected to be outside of a desired range.

The invention may be better understood with reference to the following drawings and the description. The components in the figures are not necessarily to scale, emphasis instead being placed upon illustrating the principles of the invention. Moreover, in the figures, like referenced numerals designate corresponding parts throughout the different views.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description as well as in the claims, designations of certain elements as "first element", "second element", "third element" etc. are not to be understood as enumerative. Instead, such designations serve solely to address different "elements". That is, e.g., the existence of a "third element" does not necessarily require the existence of a "first element" and a "second element". An electrical line or electrical connection as described herein may be a single electrically conductive element, or include at least two individual electrically conductive elements connected in series and/or parallel. Electrical lines and electrical connections may include metal and/or semiconductor material, and may be permanently electrically conductive (i.e., non-switchable). A semiconductor body as described herein may be made from (doped) semiconductor material and may be a semiconductor chip or be included in a semiconductor chip. A semiconductor body has electrically connectable pads and includes at least one semiconductor element with electrodes.

Figure 1:
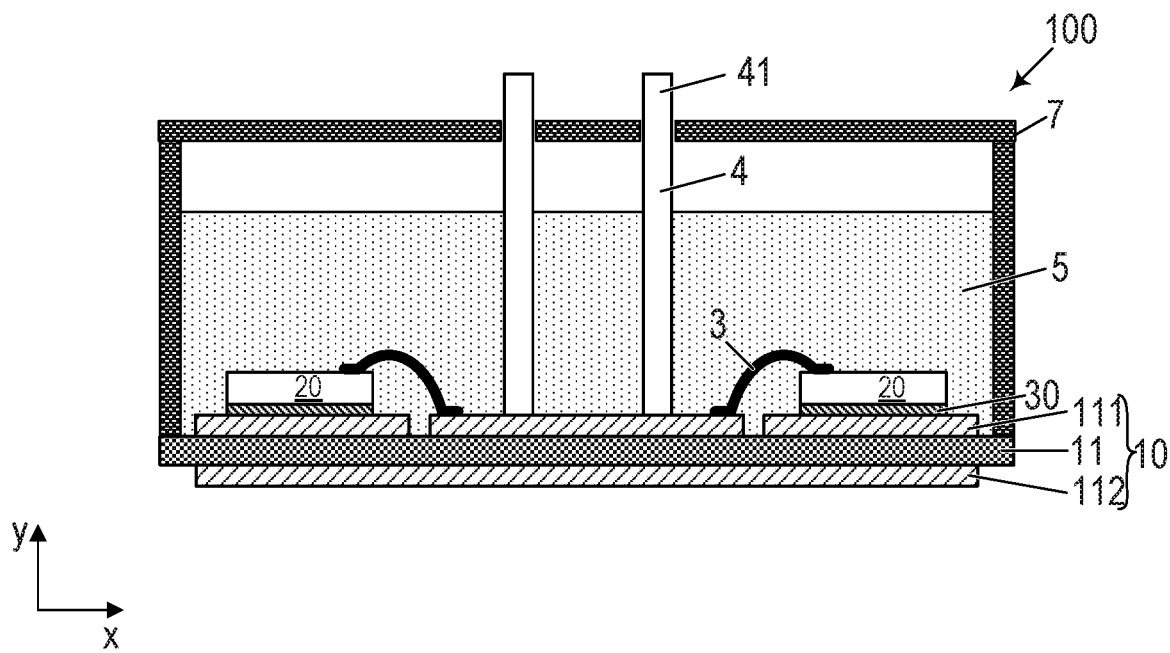
FIG. 1 is a cross-sectional view of a power semiconductor module arrangement.

Referring to FIG. 1, a cross-sectional view of a power semiconductor module arrangement 100 is illustrated. The power semiconductor module arrangement 100 includes a housing 7 and a semiconductor substrate 10. The semiconductor substrate 10 includes a dielectric insulation layer 11, a (structured) first metallization layer 111 attached to the dielectric insulation layer 11, and a (structured) second metallization layer 112 attached to the dielectric insulation layer 11. The dielectric insulation layer 11 is disposed between the first and second metallization layers 111, 112.

Each of the first and second metallization layers 111, 112 may consist of or include one of the following materials: copper; a copper alloy; aluminum; an aluminum alloy; any other metal or alloy that remains solid during the operation of the power semiconductor module arrangement. The semiconductor substrate 10 may be a ceramic substrate, that is, a substrate in which the dielectric insulation layer 11 is a ceramic, e.g., a thin ceramic layer. The ceramic may consist of or include one of the following materials: aluminum oxide; aluminum nitride; zirconium oxide; silicon nitride; boron nitride; or any other dielectric ceramic. For example, the dielectric insulation layer 11 may consist of or include one of the following materials: $Al_2O_3$, AlN, SiC, BeO or $Si_3N_4$. For instance, the substrate 10 may, e.g., be a Direct Copper Bonding (DCB) substrate, a Direct Aluminum Bonding (DAB) substrate, or an Active Metal Brazing (AMB) substrate. Further, the substrate 10 may be an Insulated Metal Substrate (IMS). An Insulated Metal Substrate generally comprises a dielectric insulation layer 11 comprising (filled) materials such as epoxy resin or polyimide, for example. The material of the dielectric insulation layer 11 may be filled with ceramic particles, for example. Such particles may comprise, e.g., $Si_2O$, $Al_2O_3$, AlN, or BN and may have a diameter of between about 1 µm and about 50 µm. The substrate 10 may also be a conventional printed circuit board (PCB) having a non-ceramic dielectric insulation layer 11. For instance, a non-ceramic dielectric insulation layer 11 may consist of or include a cured resin.

The semiconductor substrate 10 is arranged in a housing 7. In the example illustrated in FIG. 1, the semiconductor substrate 10 forms a ground surface of the housing 7, while the housing 7 itself solely comprises sidewalls and a cover. This is, however, only an example. It is also possible that the housing 7 further comprises a ground surface and the semiconductor substrate 10 is arranged inside the housing 7. According to another example, the semiconductor substrate 10 may be mounted on a base plate. The base plate may form a bottom of the housing 7. In some power semiconductor module arrangements 100, more than one semiconductor substrate 10 is arranged within the same housing 7.

One or more semiconductor bodies 20 may be arranged on the at least one semiconductor substrate 10. Each of the semiconductor bodies 20 arranged on the at least one semiconductor substrate 10 may include a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), or any other suitable semiconductor element.

The one or more semiconductor bodies 20 may form a semiconductor arrangement on the semiconductor substrate 10. In FIG. 1, only two semiconductor bodies 20 are exemplarily illustrated. The second metallization layer 112 of the semiconductor substrate 10 in FIG. 1 is a continuous layer. The first metallization layer 111 is a structured layer in the example illustrated in FIG. 1. "Structured layer" in this context means that the first metallization layer 111 is not a continuous layer, but includes recesses between different sections of the layer. Such recesses are schematically illustrated in FIG. 1. The first metallization layer 111 in this example includes three different sections. Different semiconductor bodies 20 may be mounted to the same or to different sections of the first metallization layer 111. Different sections of the first metallization layer may have no electrical connection or may be electrically connected to one or more other sections using, e.g., bonding wires 3. Electrical connections 3 may also include bonding ribbons, connection plates or conductor rails, for example, to name just a few examples. The one or more semiconductor bodies 20 may be electrically and mechanically connected to the semiconductor substrate 10 by an electrically conductive connection layer 30. Such an electrically conductive connection layer may be a solder layer, a layer of an electrically conductive adhesive, or a layer of a sintered metal powder, e.g., a sintered silver (Ag) powder, for example.

The power semiconductor module arrangement 100 further includes terminal elements 4. The terminal elements 4 are electrically connected to the first metallization layer 111 and provide an electrical connection between the inside and the outside of the housing 7. The terminal elements 4 may be electrically connected to the first metallization layer 111 with a first end, while a second end 41 of the terminal elements 4 protrudes out of the housing 7. The terminal elements 4 may be electrically contacted from the outside at their second end 41. Such terminal elements 4, however, are only an example. The components inside the housing 7 may be electrically contact from outside the housing 7 in any other suitable way. For example, terminal elements 4 may be arranged closer to or adjacent to the sidewalls of the housing 7. It is also possible that terminal elements 4 protrude vertically or horizontally through the sidewalls of the housing 7. It is even possible that terminal elements 4 protrude through a ground surface of the housing 7. The first end of a terminal element 4 may be electrically and mechanically connected to the semiconductor substrate 10 by an electrically conductive connection layer (not explicitly illustrated in FIG. 1). Such an electrically conductive connection layer may be a solder layer, a layer of an electrically conductive adhesive, or a layer of a sintered metal powder, e.g., a sintered silver (Ag) powder, for example.

The power semiconductor module arrangement 100 generally further includes a casting compound 5. The casting compound 5 may consist of or include a silicone gel or may be a rigid molding compound, for example. The casting compound 5 may at least partly fill the interior of the housing 7, thereby covering the components and electrical connections that are arranged on the semiconductor substrate 10. The terminal elements 4 may be partly embedded in the casting compound 5. At least their second ends 41, however, are not covered by the casting compound 5 and protrude from the casting compound 5 through the housing 7 to the outside of the housing 7. The casting compound 5 is configured to protect the components and electrical connections inside the power semiconductor module 100, in particular inside the housing 7, from certain environmental conditions and mechanical damage. It is generally also possible to omit the housing 7 and solely protect the substrate 10 and any components mounted thereon with a casting compound 5. In this case, the casting compound 5 may be a rigid material, for example.

Figure 2A:
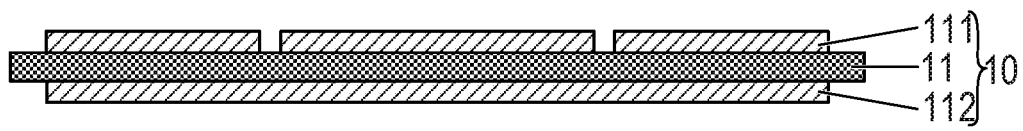
FIGS. 2A-2C schematically illustrate an exemplary method for forming a sinter connection.
Figure 2B:
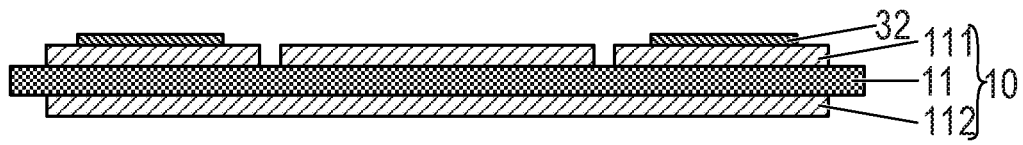
Figure 2C:
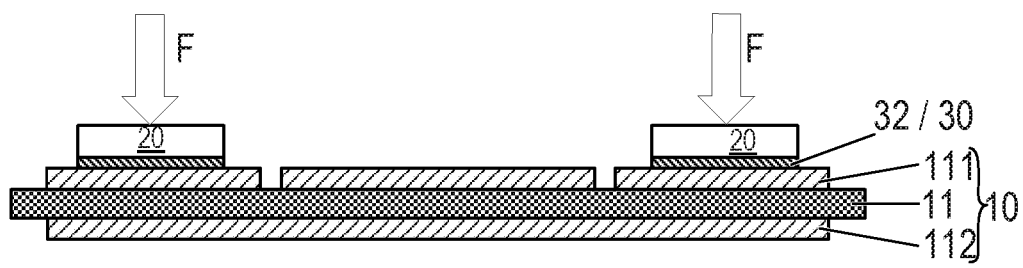

Now referring to FIGS. 2A through 2C, a method for forming a connection between two connection partners is exemplarily illustrated. A first connection partner 10 may consist of or include a metal or a ceramic, for example. The second connection partner 20 may also consist of or include a metal or a ceramic. For example, at least a top surface of the first connection partner 10 which faces towards the second connection partner 20 may consist of or include a metal or a ceramic. At least a bottom surface of the second connection partner 20, which faces the first connection partner 10, generally also at least partially consists of or includes a metal. The first connection partner 10 in the example illustrated in FIGS. 2A through 2C is a semiconductor substrate, and the second connection partner 20 is a semiconductor body. Other connection partners, however, are also possible, e.g., semiconductor substrate and a base plate, or connection element and semiconductor substrate. FIG. 2A illustrates a cross-sectional view of a first connection partner 10 before connecting it to one or more second connection partners 20. The semiconductor substrate 10 illustrated in FIGS. 2A through 2C corresponds to the semiconductor substrate 10 that has been described with respect to FIG. 1 above. That is, any type of semiconductor substrate 10 is generally possible.

In a first step, illustrated in FIG. 2B, a pre-connection layer 32 is formed on the first metallization layer 111 (top surface) of the semiconductor substrate 10. The pre-connection layer 32 may be applied to the first connection partner 10 using screen printing, stencil printing, inkjet printing, or spray-on techniques, for example. The pre-connection layer 32 may be formed of a paste including a metal powder, e.g., a silver (Ag) powder. The individual particles of the metal powder in the paste may already be slightly connected to each other. The paste may be wet and have a viscous consistency when the at least one second connection partner 20 is arranged on the pre-connection layer 32 (see FIG. 2C). It is, however, also possible that the pre-connection layer 32 is at least slightly dried (e.g., moisture at least partially removed from paste) when arranging the second joining partner 20 on the pre-connection layer 32. During the mounting process, the second connection partner 20 is pressed onto the first connection partner 10. A pre-connection process (e.g., a heating step) may be performed after applying the pre-connection layer 32 to the first connection partner 10, and before arranging the second connection partner 20 on the pre-connection layer 32. As is illustrated in FIG. 2C, after arranging the second connection partner 20 on the pre-connection layer 32, a force F may be exerted on the second connection partner 20 in order to press it down on the pre-connection layer 32 and towards the first connection partner 10. For example, an appropriate mounting tool (not specifically illustrated in FIGS. 2A through 2C) may be pressed onto the second connection partner 20 in order to apply pressure to the second joining partner 20. Under pressure, the pre-connection layer 32 is compressed to a certain degree, resulting in a connection layer 30 forming a firm substance-to-substance bond between the first connection partner 10 and the second connection partner 20. The arrangement may additionally be heated during the mounting process. That is, when applying a force F on the second connection partner 20, the connection partners 10, 20 and/or the pre-connection layer 32 may be heated at the same time. For example, the components may be heated to up to about 300° C. or even higher.

As has been described before, the pre-connection layer 32 may be at least slightly dried (e.g., moisture at least partially removed from paste) before arranging the second joining partner 20 on the pre-connection layer 32. A pre-connection process, e.g., a drying process, may include applying heat to the pre-connection layer 32, for example, thereby evaporating at least some of the fluid included in the pre-connection layer 32. Drying the pre-connection layer 32 before arranging the second connection partner 20 to the pre-connection layer 32 generally allows to form a connection layer 30 having a low porosity. Further, an uncontrolled distribution of the particles included in the pre-connection layer 32 (e.g., particles of the metal powder such as Ag-particles) may be avoided in the resulting connection layer 30. Such a preceding drying step may be referred to as pre-connection process or pre-sintering process, for example. After having performed this pre-connection process, the particles of the metal powder in the paste of the pre-connection layer 32 may already be slightly connected to each other (so-called necking) but remain identifiable as separate particles.

However, connecting the particles in the pre-connection layer to a desired degree and still being able to identify them as separate particles requires a defined process time under defined process conditions, such as a defined temperature, for example. In other words, the correct quantity of moisture needs to be removed from the pre-connection layer to be able to guarantee a reliable connecting layer 30 at the end of the pre-connection process. If the pre-connection layer 32 is dried too much (too much liquid removed from the pre-connection layer 32), the particles of the pre-connection layer are no longer identifiable as separate particles and the mechanical stability of the resulting connection layer 30 (e.g., after performing a sintering process) may be insufficient. That is, there is a risk that the second connection partner 20 will not sufficiently adhere to the first connection partner 10. On the other hand, if the pre-connection layer 32 is not dried enough (not enough liquid removed from pre-connection layer 32), this may also lead to a nonsatisfactory mechanical stability of the resulting connection layer 30 and further to an insufficient thermal coupling between the first connection partner 10 and the second connection partner 20 due to voids, cavities or blowholes that may result from the insufficient drying process. For example, if too much liquid remains in the pre-connection layer 32, "drying channels" may be formed due to cavities or blowholes during a following sintering process. Therefore, it is important to terminate the pre-connection process at the correct moment under the given process conditions.

It is generally possible to determine a current state of the pre-connection layer 32, e.g., using a manual process or manual test. A manual test includes an operator wiping a finger along the pre-connection layer 32, manually feeling whether the correct degree of drying has been reached or even exceeded (manual palpation). However, this manual test is rather inaccurate and bears a high risk that the operator will not evaluate the current state of the pre-connection layer 32 correctly. Detecting slight process changes manually is rather difficult for the operator, if not impossible.

Figure 3:
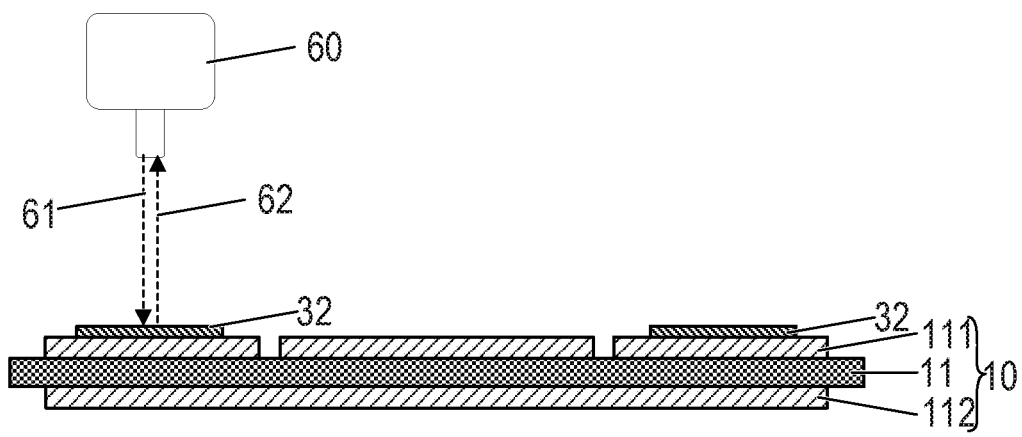
FIG. 3 is a cross-sectional view of a connection partner during the process of monitoring a connection layer according to one example.

Now referring to FIG. 3, a process for monitoring a pre-connection layer 32 is schematically illustrated. The pre-connection layer in the example illustrated in FIG. 3 has already been dried to a certain degree. That is, a certain amount of liquid has been removed from the pre-connection layer 32. During the pre-connection process, the detectable color impression of the pre-connection layer 32 changes due to the loss of liquid. This color change, however, is difficult to perceive with the naked eye. Therefore, a photometric measurement device 60 is used to monitor the pre-connection layer 32. By performing photometric measurements, at least one photometric parameter of the pre-connection layer 32, or more specifically, of the light reflected from the pre-connection layer 32, may be determined. The at least one photometric parameter changes depending on the fluid content of the pre-connection layer 32 (amount of liquid still present in the pre-connection layer 32). That is, the at least one photometric parameter is indicative of the fluid content of the pre-connection layer 32. Therefore, by evaluating the at least one photometric parameter, the fluid content of the pre-connection layer 32 can be determined.

The photometric measurement device 60 may include a spectral photometer, for example. The photometric measurement device 60 may be configured to measure the reflection or transmission properties of the pre-connection layer 32 as a function of the wavelength, for example. That is, a light beam 61 may be pointed at the pre-connection layer 32, and the resulting light beam 62 that is reflected from the pre-connection layer 32 is received and evaluated. In particular, it can be determined which amount of light at which wavelengths has been absorbed by the pre-connection layer 32. The amount of absorbed light at certain wavelengths depends on the amount of liquid that is still present in the pre-connection layer 32. According to one example, a result of the measurement is a color information in a color coordinate scheme (e.g., CIE color space). Each specific color information (color combination) correlates to a certain degree of liquid that is still present in the pre-connection layer 32.

For example, if more liquid is still present in the pre-connection layer 32, different wavelengths can be absorbed by the pre-connection layer 32 as compared to a condition in which less liquid is still present in the pre-connection layer 32.

As will be described in the following, the monitoring process may be performed at different stages during the process of connecting a first connection partner 10 to a second connection partner 20.

Figure 4:
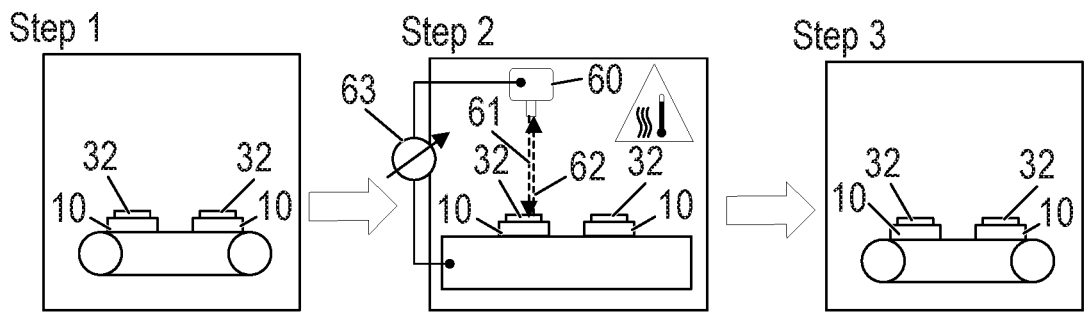
FIG. 4 schematically illustrates a method for forming a connection layer according to one example.

Now referring to FIG. 4, a method for forming a connection between two connection partners 10, 20 is exemplarily illustrated. In a first step, a pre-connection layer 32 may be formed on a first connection partner 10. In a second pre-connection step, liquid is removed from the pre-connection layer 32. The second pre-connection step may include heating the pre-connection layer 32. During the pre-connection process of removing the liquid from the pre-connection layer 32, the condition of the pre-connection layer 32 is constantly monitored. When the crucial photometric parameters of the pre-connection layer 32 are detected to be within a desired range, the second pre-connection step may be terminated such that no further liquid is removed from the pre-connection layer 32. That is, there can be constant feedback from the photometric measurement device 60 during the pre-connection step. A feedback loop 63 may provide the feedback from the photometric measurement device 60 to a process control device (not specifically illustrated in FIG. 4). The process control device may be configured to control the process parameters such as a temperature within a process chamber or a temperature of the pre-connection layer 32, for example. If it is detected that enough liquid has been removed from the pre-connection layer 32, the temperature may be reduced, for example, in order to terminate the evaporation process.

In a third step, the first connection partner 10 and the pre-connection layer 32 formed thereon may be prepared for further processing. For example, the pre-connection layer 32 may be allowed to fully cool down to a desired temperature. Evaporation of further liquid from the pre-connection layer 32 may stop once the pre-connection layer 32 cools down to a certain first temperature. However, for further processing it may be desired to further cool down the pre-connection layer 32 to a second temperature that is lower than the first temperature. The first connection partner 10 may be transported from one process chamber to another one by means of a conveyor belt, for example, as is indicated in steps 1 and 3 of FIG. 4.

Figure 5:
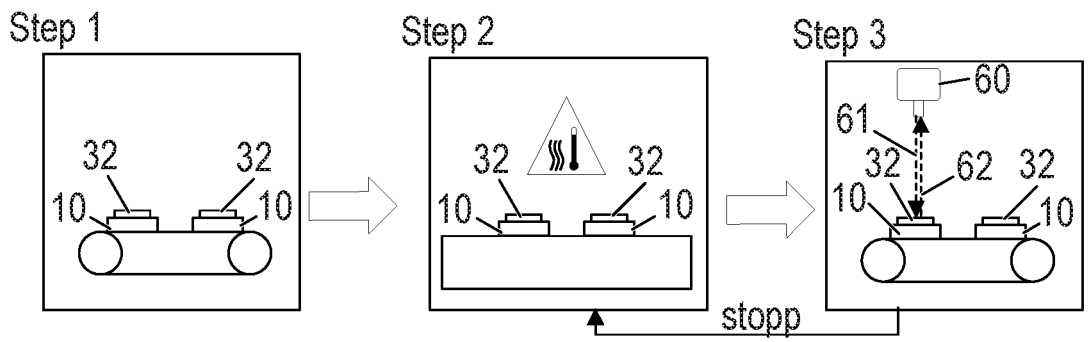
FIG. 5 schematically illustrates a method for forming a connection layer according to another example.

Now referring to FIG. 5, another method for forming a connection between two connection partners 10, 20 is exemplarily illustrated. In a first step, a pre-connection layer 32 may be formed on a first connection partner 10. In a second pre-connection step, liquid is removed from the pre-connection layer 32. The second pre-connection step may include heating the pre-connection layer 32. In a third step, the condition of the pre-connection layer 32 after removing a certain amount of liquid, may be evaluated. The first connection partner 10 may be transported from one process chamber to another one by means of a conveyor belt, for example, as is indicated in steps 1 and 3 of FIG. 5. If, during the third step of monitoring the pre-connection layer 32, the condition of a pre-connection layer 32 is detected to be outside the desired parameter range, the process of forming pre-connection layers 32 may be terminated. That is, the production line may be stopped if the condition of a pre-connection layer 32 is detected to be outside the desired parameter range. For example, the process conditions for the second pre-connection step may be manually or automatically adjusted for any subsequently formed pre-connection layers 32 before starting the production line again and producing further pre-connection layers 32. That is, in the example method illustrated in FIG. 5, the quality of the pre-connection layers 32 is controlled by monitoring the finished product (the pre-connection layer 32 after the pre-connection process and before mounting a second connection partner 20 on the pre-processing layer 32). Adjusting the process parameters, however, is only one example. Any other suitable action may be taken if the condition of a pre-connection layer 32 is detected to be outside the desired parameter range.

While in the example illustrated in FIG. 5, process parameters can only be adjusted for any further subsequent processes, the method illustrated in FIG. 4 allows to constantly monitor the production process. That is, if in the example of FIG. 5 one pre-processing layer 32 is detected to be outside the desired parameter range, the first connection partner 10 with the faulty pre-connection layer 32 formed thereon will have to be sorted out. Process parameters will then only be adjusted for any subsequent pre-connection processes. The method illustrated in FIG. 4, on the other hand, avoids the production of any faulty pre-connection layers 32. This is because each process is monitored simultaneously.

With both methods, the yield of a production line can be improved. This is because in both cases early warnings will be received when process parameters unintentionally shift, resulting in faulty products.

Heating the pre-connection layer 32 in order to evaporate liquid can be performed in any suitable way. For example, the first connection partner 10 with the pre-connection layer 32 arranged thereon may be arranged on a heatable surface. The heat is transferred through the first connection partner 10 to the pre-connection layer 32. Other possible heating mechanisms include inductive heating systems or radiation heating systems, for example, just to name a few examples. The drying process may be performed in a dedicated process chamber, for example. According to one example, the drying process is performed in a vacuum and in a controlled atmosphere.

The methods for forming a connection between two connection partners and for monitoring a connection layer have been described with respect to semiconductor bodies and semiconductor substrates. This, however, is only one example. Any other connection partners in the field of semiconductor modules may be connected to each other using the described methods. For example, semiconductor substrates may be connected to a base plate. However, the methods are not restricted to the field of semiconductor substrates. The methods may also be used when connecting connection partners anywhere in the field of electrical industry, e.g., sintering of ceramic components, or automotive industry, for example.

What is claimed is:

1. A method, comprising:
    forming a pre-connection layer on a first surface of a first connection partner, the pre-connection layer comprising a certain amount of liquid; and
    before arranging a second connection partner on the pre-connection layer:
        performing a pre-connection process, thereby removing liquid from the pre-connection layer;
        performing photometric measurements while performing the pre-connection process, wherein performing the photometric measurements comprises determining at least one photometric parameter of the pre-connection layer, wherein the at least one photometric parameter changes depending on the fluid content of the pre-connection layer; and
        constantly evaluating the at least one photometric parameter, wherein the pre-connection process is terminated, when the at least one photometric parameter is detected to be within a desired range.

2. The method of claim 1, wherein the pre-connection process comprises heating at least the pre-connection layer.

3. The method of claim 1, wherein the pre-connection layer comprises a paste comprising a metal powder formed by a plurality of metal particles.

4. The method of claim 3, wherein the metal powder is formed by a plurality of silver particles.

5. The method of claim 3, wherein the pre-connection process comprises forming connections between the particles of the metal powder.

6. The method of claim 5, wherein the pre-connection process is terminated at a stage of the pre-connection layer where the particles of the metal powder are still identifiable as separate particles.

7. The method of claim 1, wherein performing photometric measurements comprises:
    pointing a light beam at the pre-connection layer; and
    determining at least one photometric parameter of a resulting light beam that is reflected from the pre-connection layer.

8. The method of claim 1, wherein the at least one photometric parameter comprises an amount of light at different wavelengths that is reflected by the pre-connection layer.

9. A method for monitoring a connection process, comprising:
    successively forming a plurality of pre-connection layers;
    after forming a pre-connection layer, performing photometric measurements, wherein performing the photometric measurements comprises determining at least one photometric parameter of the pre-connection layer, wherein the at least one photometric parameter depends on a fluid content of the pre-connection layer; and
    evaluating the at least one photometric parameter,
    wherein each pre-connection layer is formed on a first surface of a first connection partner,
    wherein each pre-connection layer comprises a certain amount of liquid,
    wherein forming a pre-connection layer comprises performing a pre-connection process under certain process conditions, thereby removing liquid from the pre-connection layer,
    the method further comprising interrupting the process of forming a plurality of pre-connection layers if the at least one photometric parameter is detected to be outside of a desired range,
    wherein the pre-connection process and the photometric measurements are performed before arranging a second connection partner on each pre-connection layer.

10. The method of claim 9, wherein the pre-connection process comprises heating at least the pre-connection layer.

11. The method of claim 9, further comprising:
    manually or automatically adjusting the process conditions for any subsequently formed pre-connection layers before starting the production line again and producing further pre-connection layers.

12. The method of claim 9, wherein the pre-connection layer comprises a paste comprising a metal powder formed by a plurality of metal particles.

13. The method of claim 12, wherein the pre-connection process comprises forming connections between the particles of the metal powder.

14. The method of claim 9, wherein performing photometric measurements comprises:
    pointing a light beam at the pre-connection layer; and
    determining at least one photometric parameter of a resulting light beam that is reflected from the pre-connection layer.

15. The method of claim 9, wherein the at least one photometric parameter comprises an amount of light at different wavelengths that is reflected by the pre-connection layer.

* * * * *